(12) United States Patent
DeOrnellas et al.

(10) Patent No.: US 7,439,188 B2
(45) Date of Patent: Oct. 21, 2008

(54) REACTOR WITH HEATED AND TEXTURED ELECTRODES AND SURFACES

(75) Inventors: Stephen DeOrnellas, Santa Rosa, CA (US); Leslie Jerde, Santa Rosa, CA (US); Kurt Olson, Novato, CA (US)

(73) Assignee: Tegal Corporation, Petaluma, CA (US)

(*) Notice: Subject to any disclaimer, the term of this patent is extended or adjusted under 35 U.S.C. 154(b) by 0 days.

(21) Appl. No.: 09/888,365

(22) Filed: Jun. 22, 2001

(65) Prior Publication Data

US 2002/0036064 A1    Mar. 28, 2002

Related U.S. Application Data

(63) Continuation of application No. 09/453,842, filed on Dec. 2, 1999, now abandoned.

(51) Int. Cl.
*H01L 21/302* (2006.01)
*C23F 1/00* (2006.01)

(52) U.S. Cl. .......... 438/720; 438/710; 216/67; 216/71; 216/75

(58) Field of Classification Search .......... 438/710, 438/714, 715, 720, 963; 216/67, 71, 75
See application file for complete search history.

(56) References Cited

U.S. PATENT DOCUMENTS

| | | | |
|---|---|---|---|
| 3,514,391 A | 5/1970 | Hablanian et al. | 204/298 |
| 4,033,287 A | 7/1977 | Alexander, Jr. et al. | 118/49.1 |
| 4,208,241 A | 6/1980 | Harshbarger et al. | 156/643 |
| 4,457,359 A | 7/1984 | Holden | 165/80 |
| 4,508,161 A | 4/1985 | Holden | 165/1 |
| 4,512,391 A | 4/1985 | Harra | 165/48 |
| 4,535,834 A | 8/1985 | Turner | 165/80 |
| 4,542,298 A | 9/1985 | Holden | 250/443 |
| 4,680,061 A | 7/1987 | Lamont, Jr. | 148/1.5 |
| 4,743,570 A | 5/1988 | Lamont, Jr. | 437/248 |
| 5,031,571 A | 7/1991 | Igarashi et al. | 118/723 |
| 5,272,417 A * | 12/1993 | Ohmi | 156/345.47 |
| 5,277,751 A | 1/1994 | Ogle | 156/643 |
| 5,362,350 A | 11/1994 | Yanagida | 156/643 |
| 5,445,709 A | 8/1995 | Kojima et al. | 216/71 |
| 5,556,501 A * | 9/1996 | Collins et al. | 156/345.38 |

(Continued)

FOREIGN PATENT DOCUMENTS

| | | | |
|---|---|---|---|
| JP | 07130712 A | | 5/1995 |
| WO | WO 97/27622 | * | 7/1997 |
| WO | WO 99/25568 | * | 5/1999 |

OTHER PUBLICATIONS

Ohno et al., *Reactive Ion Etching of Cooper Films in $SiCl_4$ and $N_2$ Mixture*, Japanese Journal of Applied Physics, vol. 28, No. 6, Jun. 1978, pp. 11070-11072.

(Continued)

*Primary Examiner*—Luz L. Alejandro
(74) *Attorney, Agent, or Firm*—Fliesler Meyer LLP

(57) ABSTRACT

A reactor for processing semiconductor wafers with electrodes and other surfaces that can be one of heated, textured and/or pre-coated in order to facilitate adherence of materials deposited thereon, and eliminate the disadvantages resulting from the spaulding, flaking and/or delaminating of such materials which can interfere with semiconductor wafer processing.

12 Claims, 5 Drawing Sheets

U.S. PATENT DOCUMENTS

| | | | | |
|---|---|---|---|---|
| 5,628,869 | A | 5/1997 | Mallon | 438/694 |
| 5,661,093 | A | 8/1997 | Ravi | 438/763 |
| 5,708,557 | A | 1/1998 | Feigenbaum et al. | 361/234 |
| 5,753,566 | A | 5/1998 | Hwang | 438/715 |
| 5,800,618 | A | 9/1998 | Niori et al. | 118/723 |
| 5,800,619 | A | 9/1998 | Holland et al. | 118/723 |
| 5,804,046 | A | 9/1998 | Sawada et al. | 204/298.11 |
| 5,814,154 | A | 9/1998 | Boitnott | 118/723 |
| 5,820,947 | A | 10/1998 | Itoh | 427/577 |
| 5,833,752 | A | 11/1998 | Martin | 118/723 |
| 5,837,057 | A | 11/1998 | Koyama et al. | 118/723 |
| 5,874,704 | A | 2/1999 | Gates | 219/121.43 |
| 5,876,504 | A | 3/1999 | Fuji et al. | 118/723 |
| 5,904,487 | A | 5/1999 | Conboy et al. | 438/14 |
| 6,001,432 | A * | 12/1999 | Yamazaki et al. | 427/577 |
| 6,007,673 | A | 12/1999 | Kugo et al. | 156/345 |
| 6,046,116 | A * | 4/2000 | DeOrnellas et al. | 438/715 |
| 6,070,550 | A | 6/2000 | Ravi | 118/723 |
| 6,071,573 | A | 6/2000 | Koemtzopoulos et al. | 427/578 |
| 6,214,740 | B1 * | 4/2001 | Imai et al. | 438/710 |

OTHER PUBLICATIONS

Krogh et al., *Spectroscopic Dianostics of Temperature-Controlled Trench Etching of Silicon*, Plasma Chemistry Plasma Processes, 10(2), 1990, pp. 231-233, 239.

PCT Notification of Transmittal of the International Search Report or the Declaration for PCT/US98/23297, Int'l Filing Date Nov. 3, 1998, mailed Feb. 28, 2000.

Alan R. Reinberg, *Plasma Etch Equipment Technology, M. Triodes*, Perkin-Elmer Corporation, Norwalk, Connecticut, © 1989 by Academic Press, Inc., ISBN 0-12-469370-p; pp. 350-351.

Plasma Etching Technology, Feb. 10-11, 1997, Burlingame, California, Continuing Education in Engineering, University Extension, U. of California, Berkeley, *Plasma Etching Technology An Overview*, D.L. Flamm, 1992-1996, title 95011501 v2, D.L. Flamm 1995, src5012608, 3 pgs.

* cited by examiner

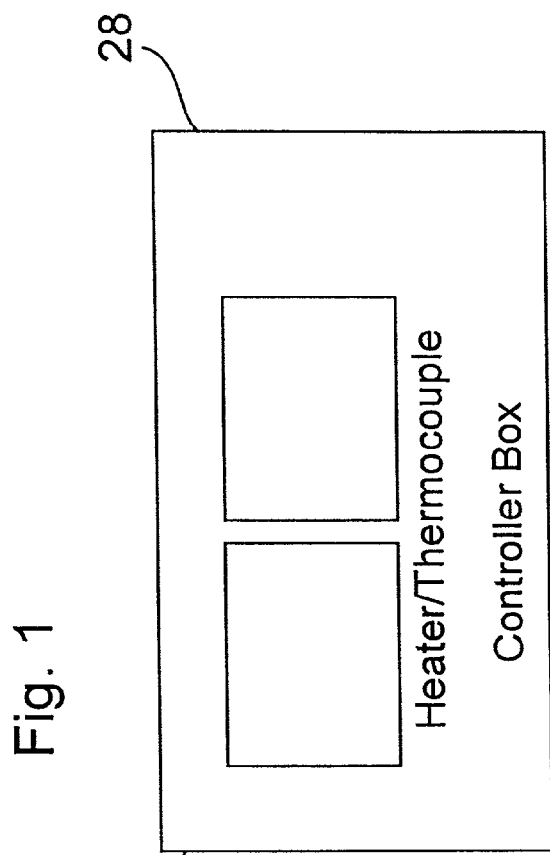

REACTOR WITH HEATED AND TEXTURED ELECTRODES AND SURFACES

CROSS-REFERENCE

This application is a continuation of Ser. No. 09/453,842, filed Dec. 2, 1999.

Cross-referenced and incorporated by reference are U.S. Patent Applications entitled A METHOD FOR MINIMIZING THE CRITICAL DIMENSION GROWTH OF A FEATURE ON A SEMICONDUCTOR WAFER filed on Nov. 19, 1997, and with Ser. No. 08/974,089, issued Apr. 4, 2000 as U.S. Pat. No. 6,046,116; and U.S. Patent Application entitled PLASMA REACTOR WITH A DEPOSITION SHIELD, filed on Dec. 5, 1997, and with Ser. No. 08/985,730, now abandoned; and U.S. Patent Application entitled PLASMA REACTOR WITH A DEPOSITION SHIELD filed on Dec. 1, 1998, and with Ser. No. 09/204,020, issued Dec. 28, 1999 as U.S. Pat. No. 6,006,694.

FIELD OF THE INVENTION

The present invention is directed to reactors and in particular reactors for processing objects with films such as semiconductor wafers.

BACKGROUND OF THE INVENTION

During fabrication of semiconductor chips, wafers are processed in reactors which can accomplish various steps associated with the definition of the functionality of the semiconductor chip. Such reactors can, for example, perform deposition and etching processes through the use of various gases which are part of the fabrication process. During the etch process, by way of example, gaseous input materials as well as materials from the substrate being etched and combinations thereof can be deposited on the internal surface present in the reactor itself. Such surfaces include reactor walls, reactor electrodes, the reactor chuck and the like. Each processing tool, depending on the processing run, will have a regular scheduled down period during which the internal surfaces of the reactor will be cleaned and parts such as electrodes will be repaired and/or replaced.

The deposits which form on the various surfaces found in the reactor are known to have a detrimental effect to the fabrication of the semiconductor wafer product in the reactor. By way of example only, such deposits and layers on surfaces of the reactor can be thick and have poor reactor surface adhesion qualities. Additionally, the deposits or layers may not be very durable. All this potentially leads to the flaking or spaulding off of portions of the deposits or layers from the surfaces of the reactor. Such flaking or spaulding can interfere with the uniform processing of the surface of the wafer. For example, materials which flake or spauld from the surface of a reactor can redeposit on the surface of the wafer being processed, potentially damaging the functionality being fabricated on the wafer.

SUMMARY OF THE INVENTION

The present invention is directed to overcoming the problems associated with prior reactors. The present invention includes apparatus and method for ensuring that any materials that are deposited on the internal surfaces of the reactor are thin and more durable than those deposited by prior art reactors and that such deposits adhere more readily to the internal surfaces of the reactor.

Accordingly, it is an object of the invention to provide an apparatus and method which ensures that any layers or deposits on the internal surfaces of the reactor are thin, durable and adhere well to the surface of the reactor so that the deposits do not flake or spauld, potentially interfering with the process of defining the various layers which are being fabricated on a wafer.

It is to be understood that embodiments of the present invention can be used in the construction and fabrication of semiconductor chips as well as in the construction and fabrication of any other product. Such other products can include thin film read/write heads for a disk drive which requires the fabrication of circuitry on a substrate or which requires the fabrication of layers. Generally any construct having layers with features of submicron dimensions can benefit from the present invention.

Accordingly, it is another object of the present invention to provide reactor when the various surfaces of the reactor are heated to a temperature above that which would normally occur in the reactor in order to ensure that any materials deposited on the surface adhere well to the surface.

A further object of the present invention is to provide one or more electrodes, in particular the top electrode, of a reactor with a heater in order to ensure that the deposits and materials on the electrode adhere well to the electrode.

Still a further object of the invention is to provide the reactor with a reactor chamber and surfaces which are textured in order to encourage adherence of materials deposited thereon so that such materials do not flake or spauld off, interfering with the processing of a wafer.

In particular, it is an object of the present invention to provide an electrode and principally a top electrode of such a reactor with a textured surface in order to ensure that any material deposited thereon adheres to the reactor.

It is a further object of the present invention to provide a deposition shield which can be at least one of heated and/or textured in order to ensure that any materials deposited thereon adhere to the surface and do not flake or spauld off, potentially interfering with the processing of the substrate.

It is yet a further aspect of the present invention to coat the internal surfaces of the reactor with adhesion promoters which encourage the development of durable deposits which are less likely to flake or spauld and thus interfere with the processing of the work piece.

Further aspects and objects of the invention can be obtained from a review of the detailed description of the invention, the figures and the claims.

BRIEF DESCRIPTION OF THE FIGURES

FIG. 1 is a schematical plan sectional view of an electrode with heaters.

FIG. 2 is a cross sectional view of the electrode of FIG. 1.

DETAILED DESCRIPTION OF THE PREFERRED EMBODIMENT

Figure 3A:
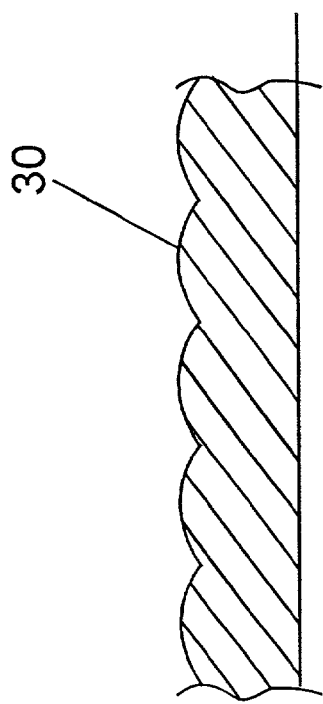
FIGS. 3a, 3b, and 3c, are cross-sections of textured surfaces of embodiments of the invention.

Embodiment With a Heated Upper, Lower and Side Electrodes and Other Heated Surfaces:

Reactor embodiment of the present invention can include heated electrode, deposition shield and/or other surfaces. By way of example only, FIGS. 1 and 2 depict plan and cross-sectional views of an upper electrode 20 for a reactor, and in particular of an etch reactor. The upper electrode has bores 22 provided therein which can receive heating elements 24. In this particular embodiment, two of the heating elements 24 are preferably cartridge heaters with an internal thermocouple. The third element 26 is a cartridge heater used as a thermocouple in order to sense the temperature. The cartridge heaters 24 and the cartridge heater 26 using a thermocouple are connected to a controller box 28 which uses the sensed temperature to maintain the level of heat generated by the cartridge heaters and thus the temperature of the upper electrode. In this preferred embodiment, the heaters are resistive type heaters. It is to be understood that other heaters can be employed and be within the spirit and scope of the invention. It is to be understood that the same technique can be used to heat electrode shields, and other surfaces and walls of the reactor.

In a preferred embodiment, where the electrode is made out of aluminum, the upper electrode (and/or the electrode opposite to the electrode or chuck holding a wafer to be processed) is preferably heated to a maximum temperature of about 300 to about 350 degrees C. With the upper electrode made of graphite or silicon, the maximum temperature is preferably about 400 to about 500 degrees C.

Without being so heated, in a typical etch reactor, the upper electrode would be floating at a maximum temperature of about 100 degrees C.

In a typical reactor, during the processing of a substrate such as a semiconductor wafer, reaction gases, materials from the wafer and combination thereof can be deposited on the various internal surface of the reactor and chamber, such as for example, the electrode. With the heated electrode of the above embodiment, the deposits are thinner, more adherent and more durable than is experienced when such reaction materials are deposited on non-heated surfaces. More particularly, when reactors and in particular etch reactor process substrate with platinum, the deposited layer on the electrode and other surfaces is more likely to be mostly platinum and not combinations of platinum with other gases such as chlorine and oxygen. Such other gases de-absorb or boil off from the surfaces in order to leave a more thin, durable and adhesive platinum layer. This layer accordingly sticks better to the surface of the electrode and does not easily flake or spauld off. Accordingly, there is less of a likelihood that any materials deposited on the electrode will flake off from the electrode and ruin the substrate being processed.

It has been found that by using heated upper electrodes, that there can be a reduction of seven-fold and even greater in the deposit thickness of materials on the upper eductor. A stronger interfaced between the surface and the deposit is also experienced.

Figure 6:
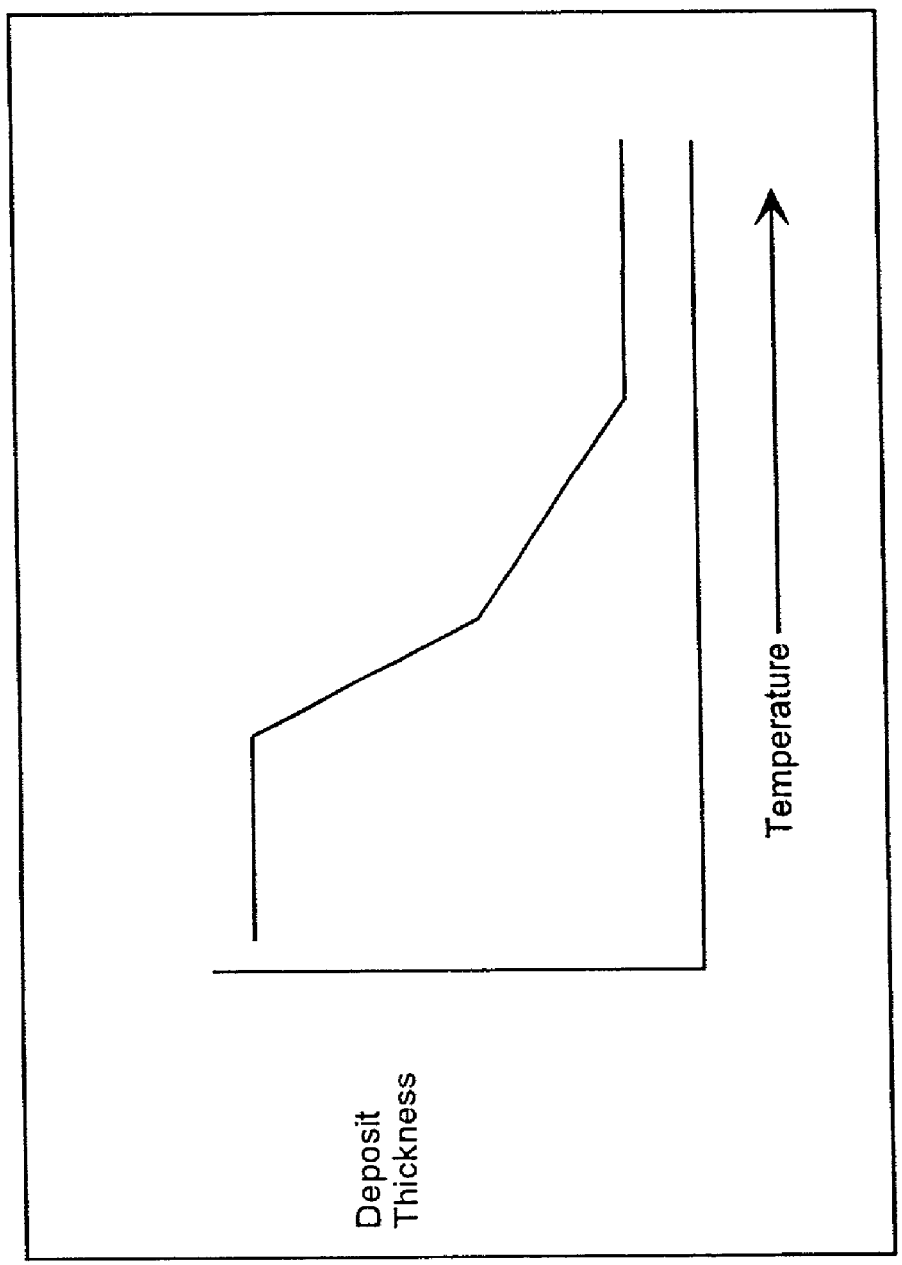
FIG. 6 is a graph depicting a reduction in deposit thickness and halogen content as the electrode temperature is increased.

The graph of FIG. 6 demonstrates that as the temperature of the surface is increased, the deposit thickness greatly decreases along with the content of halogens (for halogen gas system) in the deposited material. With a decrease in halogen compounds (such as $PtCl_x$), the deposited materials are thinner and more adherent and tend toward a simple material such as platinum.

It is to be understood that although the above embodiment was discussed with respect to a heated upper electrode, that other surfaces present inside the reactor chamber can be also heated in order to accomplish the same benefit with respect to that surface. Further, it is to be understood that shields can be used to protect the electrode and other components, which shields are consumable and which shields can be heated and benefit from the present invention.

It is also to be understood that the present invention is most useful for etching non-volatile material such as, by way of example only, platinum (Pt), Iridium (Ir), barium strontium titanate (BST), lead zirconium titanate (PZT), bismuth strontium tantalate (SBT), Iridium Oxide ($IrO_2$), Titanium Nitride (TiN), and other non-volatile materials.

Other heating techniques, such as through the use of lamps to heat electrode and surfaces can be employed in order to enjoy the benefit of the present invention.

Embodiment With a Textured Upper, Lower and Side Electrodes and Other Textured Surfaces:

In another preferred embodiment of the invention, the upper electrode and for that matter, other surfaces that are inside of the reaction chamber, can be textured such that layers that are deposited thereon have less likelihood of flaking or spaulding off, potentially contaminating the reaction. Such structures are particularly useful for etching non-volatile materials as described hereinabove. Such surface texturing promotes adhering of the deposits to the surface. Texturing can be as effective with capacitively coupled reactors. Further, inductively coupled reactors can also benefit from a texturing technique.

Figure 3B:
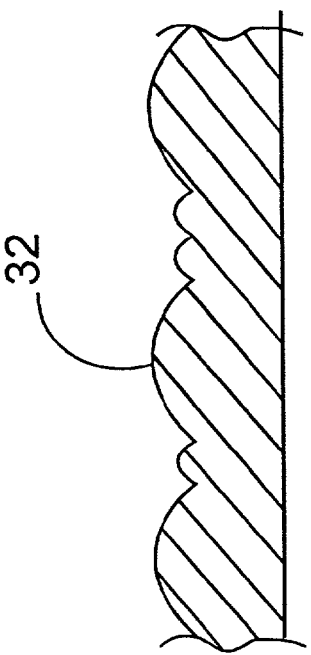
Figure 3C:
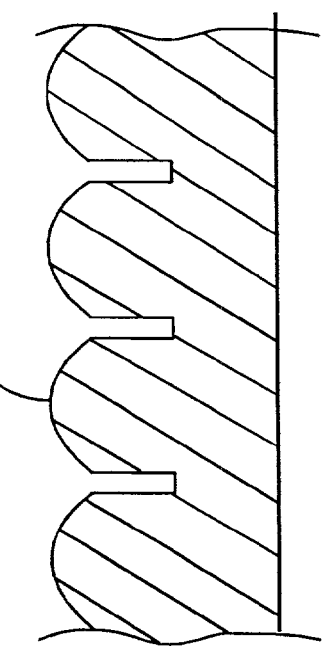

Texturing can take a variety of shapes and forms, both regular and irregular. The FIGS. 3, 4, and 5 demonstrate several different representative embodiments for texturing. The first embodiments (FIGS. 3a, 3b, and 3c) show surfaces 30, 32, 34 which are scalloped. The scallops presented are convex in shape toward the reactor chamber. Alternating the scallops can be concave toward the reactor chamber much as presented in FIG. 5. Such surface can be provided on the electrodes, shields for the electrode, and also on the various surfaces found inside of a reactor chamber.

Figure 5:
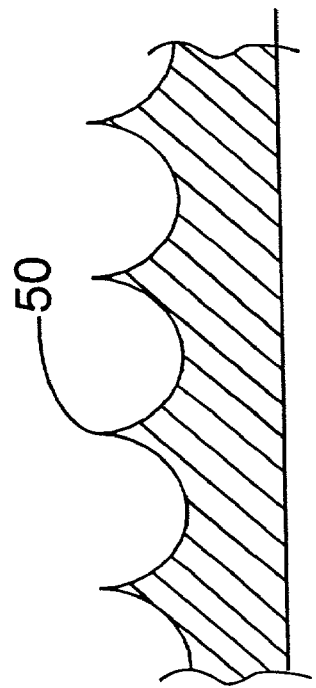
FIG. 5 is a cross-section of still a further textured surface of an embodiment of the invention.
Figure 4:
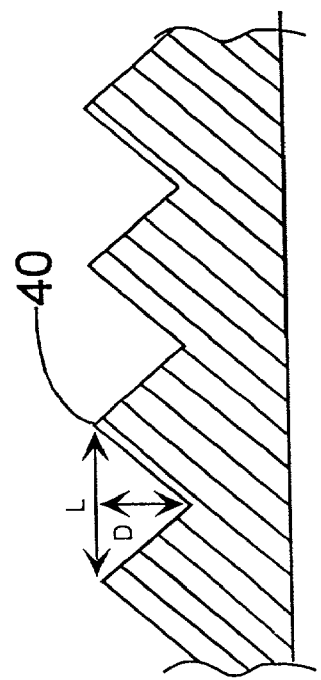
FIG. 4 is a cross-section of another textured surface of an embodiment of the invention.

Additionally, the embodiments shown in FIGS. 4 and 5 include texturing which have a series of peaks 40, 50. The effect of this texturing in some instances can be measured by the aspect ratio of the width between peaks to the depth of the valley between the peaks. Thus the aspect ratio would be:

$$\frac{W}{D}$$

With a relatively low aspect ratio, in other words, with the width much less than the depth, it can be expected that such a textured surface would be better able to capture any deposited material than a texture where the width between peaks is much greater than the depth. Additionally, a textured surface also increases the surface area upon which materials can be deposited and collected.

This embodiment with the textured surfaces as well as the embodiment with the heated electrode as indicated above prevent flaking, spaulding, delaminating, cracking and the accumulation of dust, all of which can interfere with the wafer fabrication process.

Figure 7:
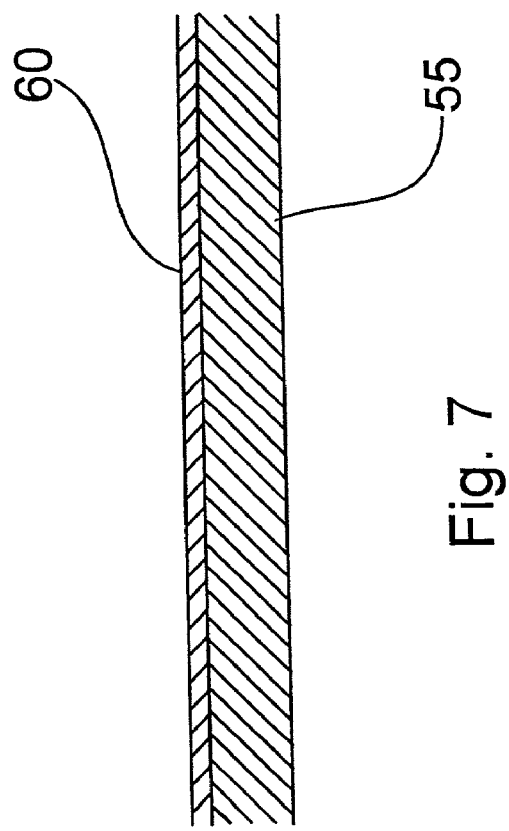
FIG. 7 is a side sectional view of a reactor surface which has been precoated.

Embodiment With Pre-Coated Surfaces:

Another embodiment (FIG. 7) of the invention for use especially with such non-volatile films includes the pre-coating of the various surfaces 55 of the reaction chamber in order to promote chemical adhesion. Such pre-coating 60 can be done with Titanium (Ti) or Titanium Nitride (TiN). The surface found in the reactor chamber can be pre-coated with materials which are the same as or compatible with the non-volatile films which are being etched. Such materials can also include Platinum (Pt), Iridium (Ir), Iridium Oxide ($IrO_2$), Barium Strontium Titanate (BST), Strontium Bismuth Tantalate (SBT), Strontium Titanate (STO), Ruthenium (Ru), Ruthenium Oxide ($RuO_2$), and Lead Zirconium Titanate (PZT).

Additionally, the sidewalls of the reactor and in particular the sidewalls of the reactor liners can be provided with a matt finish which also promotes good chemical adhesion. A matt finish is defined as follows: General texturing of a surface to facilitate the adhesion of various materials. The matting is constructed in such a way as to maximize the surface area penetrated while minimizing spaulding of the deposited film.

Figure 8:
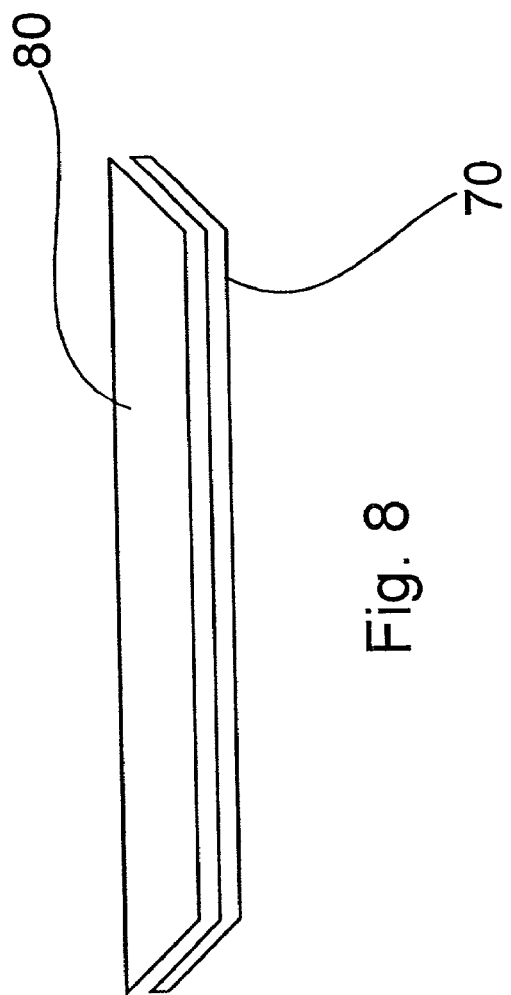
FIG. 8 is a side view of a reactor with a shield protecting a reactor surface such as an electrode.

As with the embodiments with the heated electrode and with the textured electrode, coating or pre-conditioning internal surfaces of the reactor chamber can prevent spaulding, flaking, and delaminating of any materials deposited on the surfaces, beneficially effecting the processing of semiconducting wafers or other substrates FIG. 8 shows a shield 70 which has been located adjacent to an upper electrode 80. The shield can either be heated, textured, or pre-coated, or a combination of the above and be within the spirit and scope of the invention. Texturing can include grooves, channels, perforations and/or screened surfaces.

INDUSTRIAL APPLICABILITY

The present invention advantageously uses heated and/or textured and/or pre-coated surfaces that are internal to a reactor chamber in order to ensure that materials deposited thereon adhere and do not flake, spauld or become delaminated, contaminating the process.

Other advantageous, objects and aspects of the invention can be obtained from a review of the figures and the claims.

It is to be understood that other embodiments of the invention can be developed and fall within the spirit and scope of the invention and claims. It is also to be understood that all the above embodiments described with respect to semiconductor processing can be utilized for other techniques and in other reactors where there is a requirement that materials deposited on non-workpiece surfaces adhere so that they do not delaminate and contaminate the process.

We claim:

1. A method of operating a reactor which comprises a reactor chamber, an upper electrode, a heater that heats said upper electrode, and gas inlets and outlets, the method comprising:

introducing process gas into said reactor chamber, wherein the method of operation of the reactor is a platinum etch method, and wherein oxygen and chlorine are present in the reactor;

wherein platinum and one or both of the oxygen and the chlorine are deposited on the upper electrode;

heating the upper electrode with said heater to a temperature in order to cause deposits of oxygen and chlorine to de-absorb from the upper electrode in order to leave mostly platinum deposited on the electrode, such that a layer of material is formed on the upper electrode;

wherein the layer of material formed on the upper electrode is more stable than a layer of material formed when heating the upper electrode with said heater to a temperature insufficient to cause deposits of oxygen and chlorine to de-absorb from the upper electrode.

2. The method of claim 1, wherein the step of heating using the heater that heats the upper electrode comprises heating to a temperature between about 300° C. to about 500° C.

3. The method of claim 1, wherein the reactor further comprises at least one side electrode, and a second heater provided in the at least one side electrode that heats said at least one side electrode, and gas inlets and outlets, the method further comprising:

heating the at least one side electrode with said second heater such that any material resulting from the reaction deposited on the surface of the at least one side electrode forms a stable layer of material.

4. A method of platinum etch in a reactor which comprises a reactor chamber, an upper electrode, a heater that heats said upper electrode, and gas inlets and outlets, the method comprising:

introducing process gas into said reactor chamber; and heating the upper electrode with said heater to a temperature in order to cause halogen elements to de-absorb from the upper electrode such that deposits of mostly platinum forms a layer of material;

wherein the layer of material formed on the upper electrode is more stable than a layer of material formed when heating the upper electrode with said heater to a temperature insufficient to cause deposits of mostly platinum on the surface of the upper electrode.

5. The method of claim 4, wherein the step of heating using the heater that heats the upper electrode comprises heating to a temperature between about 300° C. to about 500° C.

6. The method of claim 4, wherein the reactor further comprises at least one side electrode, and a second heater provided in the at least one side electrode that heats said at least one side electrode, and gas inlets and outlets, the method further comprising:

heating the at least one side electrode with said second heater such that any material resulting from the reaction deposited on the surface of the at least one side electrode forms a stable layer of material.

7. The method of claim 4, wherein the step of heating includes heating the surface of the upper electrode with the heater until any volatile compound of platinum collected on the surface of the upper electrode de-absorbs from the surface of the upper electrode.

8. The method of claim 7, wherein the volatile compound of platinum is a compound of platinum with chlorine or oxygen.

9. The method of claim 4, wherein the step of heating includes heating the surface of the upper electrode until any volatile compound of platinum collected on the surface of the upper electrode boils off the surface of the upper electrode.

10. The method of claim 9, wherein the volatile compound of platinum is a compound of platinum with chlorine or oxygen.

11. A method of operating a reactor which comprises a reactor chamber, an upper electrode, a heater that heats said upper electrode, and gas inlets and outlets, the method comprising:

introducing process gas into said reactor chamber, the process gas including one or both of oxygen and chlorine;

performing a platinum etch process in said reactor chamber; and heating the upper electrode with said heater to a temperature capable of decomposing one or both of platinum chloride and platinum dioxide so that a layer of material formed on the upper electrode during the platinum etch process comprises mostly platinum; and wherein the layer of material formed on the upper electrode is more stable than a layer of material formed when heating the upper electrode with said heater to a temperature insufficient to decompose the one or both of platinum chloride and platinum dioxide.

12. The method of claim 11, wherein the upper electrode comprises aluminum and the upper electrode is heated to a temperature ranging from 300° C. to 350° C.

* * * * *